(12) United States Patent
Disney

(10) Patent No.: US 10,985,084 B2
(45) Date of Patent: Apr. 20, 2021

(54) INTEGRATED III-V DEVICE AND DRIVER DEVICE PACKAGES WITH IMPROVED HEAT REMOVAL AND METHODS FOR FABRICATING THE SAME

(71) Applicant: GLOBALFOUNDRIES U.S. Inc., Santa Clara, CA (US)

(72) Inventor: Donald Ray Disney, Malta, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 14 days.

(21) Appl. No.: 16/502,266

(22) Filed: Jul. 3, 2019

(65) Prior Publication Data

US 2021/0005531 A1 Jan. 7, 2021

(51) Int. Cl.

| | |
|---|---|
| *H01L 23/373* | (2006.01) |
| *H01L 23/367* | (2006.01) |
| *H01L 23/48* | (2006.01) |
| *H01L 21/8238* | (2006.01) |
| *H02M 3/158* | (2006.01) |
| *H05K 1/02* | (2006.01) |
| *H01L 29/20* | (2006.01) |
| *H01L 23/34* | (2006.01) |
| *H01L 23/36* | (2006.01) |

(52) U.S. Cl.
CPC .. *H01L 23/3735* (2013.01); *H01L 21/823871* (2013.01); *H01L 23/34* (2013.01); *H01L 23/36* (2013.01); *H01L 23/367* (2013.01); *H01L 23/481* (2013.01); *H01L 29/2003* (2013.01); *H02M 3/1582* (2013.01); *H05K 1/0203* (2013.01)

(58) Field of Classification Search
CPC ....... H01L 23/367; H01L 23/36; H01L 23/34; H01L 23/481; H01L 23/3735; H01L 29/2003
USPC .................................................. 257/499, 713
See application file for complete search history.

(56) References Cited

U.S. PATENT DOCUMENTS

| | | | |
|---|---|---|---|
| 10,546,852 B2* | 1/2020 | Dutta | H01L 27/0623 |
| 2009/0297091 A1* | 12/2009 | Assefa | H01L 27/0688 |
| | | | 385/14 |
| 2018/0090472 A1* | 3/2018 | Disney | H01L 25/16 |
| 2018/0323575 A1* | 11/2018 | Caer | H01S 5/02484 |

(Continued)

*Primary Examiner* — David Vu
*Assistant Examiner* — Brandon C Fox
(74) *Attorney, Agent, or Firm* — Anthony Canale; Hoffman Warnick LLC

(57) ABSTRACT

Integrated circuits, wafer level integrated III-V device and CMOS driver device packages, and methods for fabricating products with integrated III-V devices and silicon-based driver devices are provided. In an embodiment, an integrated circuit includes a semiconductor substrate, a plurality of transistors overlying the semiconductor substrate, and an interlayer dielectric layer overlying the plurality of transistors with a metallization layer disposed within the interlayer dielectric layer. The plurality of transistors and the metallization layer form a gate driver circuit. The integrated circuit further includes a plurality of vias disposed through the interlayer dielectric layer, a gate driver electrode coupled to the gate driver circuit, a III-V device electrode overlying and coupled to the gate driver electrode, and a III-V device overlying and coupled to the III-V device electrode.

18 Claims, 5 Drawing Sheets

(56) References Cited

U.S. PATENT DOCUMENTS

2018/0337093 A1\* 11/2018 Chang ................. H01L 29/7786
2020/0194427 A1\* 6/2020 Dewey ................ H01L 23/5384

\* cited by examiner

INTEGRATED III-V DEVICE AND DRIVER DEVICE PACKAGES WITH IMPROVED HEAT REMOVAL AND METHODS FOR FABRICATING THE SAME

TECHNICAL FIELD

The technical field generally relates to group III-V devices, and more particularly relates to group III-V devices and their integration with driver devices, such as CMOS or silicon-based driver devices, for purposes of improving heat removal from the group III-V devices.

BACKGROUND

Group III-V semiconductor devices are semiconductor devices formed from compounds with at least one group III element (IUPAC group 13) and at least one group V element (IUPAC group 15). Group III elements include boron, aluminum, gallium, indium, and thallium. Group V elements include nitrogen, phosphorus, arsenic, antimony, and bismuth. Currently, nitrogen is the most commonly used group V element in semiconductor devices.

Group III-V semiconductor compounds, such as gallium nitride (GaN) and its related alloys, are known to be well suited for the formation of optical devices. The large bandgap and high electron saturation velocity of the group III-V semiconductor compounds also make them excellent candidates for applications in high temperature and high-speed power electronics. For example, GaN is frequently used in forming diodes and transistors including light-emitting diodes (LEDs), laser diodes, and UV photodetectors. GaN devices are particularly suited for use in power devices that are required to provide high current capability, such as radiofrequency (RF) amplification, high voltage power amplification, and optoelectronics.

However, it is difficult to obtain GaN bulk crystals due to the high equilibrium pressure of nitrogen at typical growth temperatures. To form GaN devices, GaN is commonly deposited epitaxially on silicon having a (111) crystal orientation. However, silicon (111) substrates suffer from interface traps and are not suitable for the formation of complementary metal oxide semiconductor (CMOS) devices. Therefore, GaN device fabrication and CMOS device fabrication are not commonly integrated over a common substrate.

To form integrated circuits with GaN devices and CMOS devices, CMOS devices are typically formed on a first substrate, such as a silicon (100) substrate and GaN devices are formed on a second substrate, such as a silicon (111) substrate. The GaN devices and CMOS devices are then connected together using various approaches including assembling the GaN and CMOS devices in separate semiconductor packages and connecting them on a printed circuit board, assembling the GaN and CMOS devices into a single package and connecting them via the package conductive materials and/or wire bonds, or using layer transfer techniques to physically couple the CMOS devices in their substrate and the GaN devices in their substrate. In the latter approach, electrical interconnects between GaN devices and CMOS devices can be formed using back-end-of-line (BEOL) semiconductor processes, such as the formation of multiple levels of dielectric layers and metal interconnection layers.

Because GaN semiconductor compounds are excellent candidates for applications in high temperature and high-speed power electronics, a significant amount of heat is generated at the GaN devices. Thus, the ability to remove heat generated in the GaN die limits the maximum power capability of the application. When a GaN device is integrated with a CMOS device, the interlayer dielectric (ILD) layers of the CMOS device act as a thermal barrier to the removal of heat. Moreover, the interface between the CMOS device and its underlying package or printed circuit board (PCB) further inhibits heat removal.

Accordingly, it is desirable to provide group III-V devices and CMOS compatible integration schemes that allow for increased operating speeds and temperatures. Also, it is desirable to provide group III-V devices and CMOS compatible integration schemes that increase the removal of heat from the group III-V devices. Furthermore, other desirable features and characteristics will become apparent from the subsequent detailed description and the appended claims, taken in conjunction with the accompanying drawings and this background.

BRIEF SUMMARY

Integrated circuits, wafer level integrated III-V device and CMOS driver device packages, and methods for fabricating products with integrated III-V devices and silicon-based driver devices are provided. In an embodiment, an integrated circuit includes a semiconductor substrate, a plurality of transistors overlying the semiconductor substrate, and an interlayer dielectric layer overlying the plurality of transistors with a metallization layer disposed within the interlayer dielectric layer. The plurality of transistors and the metallization layer form a gate driver circuit. The integrated circuit further includes a plurality of vias disposed through the interlayer dielectric layer, a gate driver electrode coupled to the gate driver circuit, a III-V device electrode overlying and coupled to the gate driver electrode, and a III-V device overlying and coupled to the III-V device electrode.

In another exemplary embodiment, a wafer level integrated III-V device and CMOS driver device package includes a package having conductive trace lines or a printed circuit board, a semiconductor substrate, a solderable backside metallization layer disposed between the semiconductor substrate and the package or printed circuit board, a plurality of transistors overlying the semiconductor substrate, and an interlayer dielectric layer overlying the plurality of transistors with a metallization layer disposed within the interlayer dielectric layer. The plurality of transistors and the metallization layer form a gate driver circuit. The package further includes a plurality of vias disposed through the interlayer dielectric layer, a gate driver electrode coupled to the gate driver circuit, a III-V device electrode overlying and coupled to the gate driver electrode, and a III-V device overlying and coupled to the III-V device electrode.

In yet another exemplary embodiment, a method for fabricating an integrated boost converter includes the steps of providing a semiconductor substrate, forming a plurality of transistors overlying the semiconductor substrate, and forming an interlayer dielectric layer overlying the plurality of transistors and forming a metallization layer within the interlayer dielectric layer. The plurality of transistors and the metallization layer form a gate driver circuit. The method further includes the steps of forming a plurality of vias through the interlayer dielectric layer, forming a gate driver electrode coupled to the gate driver circuit, forming a III-V device electrode overlying and coupled to the gate driver electrode, and forming a III-V device overlying and coupled to the III-V device electrode.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIGS. 3A-4A are cross-sectional views illustrating a process for forming a driver device and electrical connection structures according to one exemplary embodiment;

FIGS. 3B-4B are cross-sectional views illustrating a process for forming a driver device and electrical connection structures according to an alternative exemplary embodiment;

DETAILED DESCRIPTION

Figure 1:
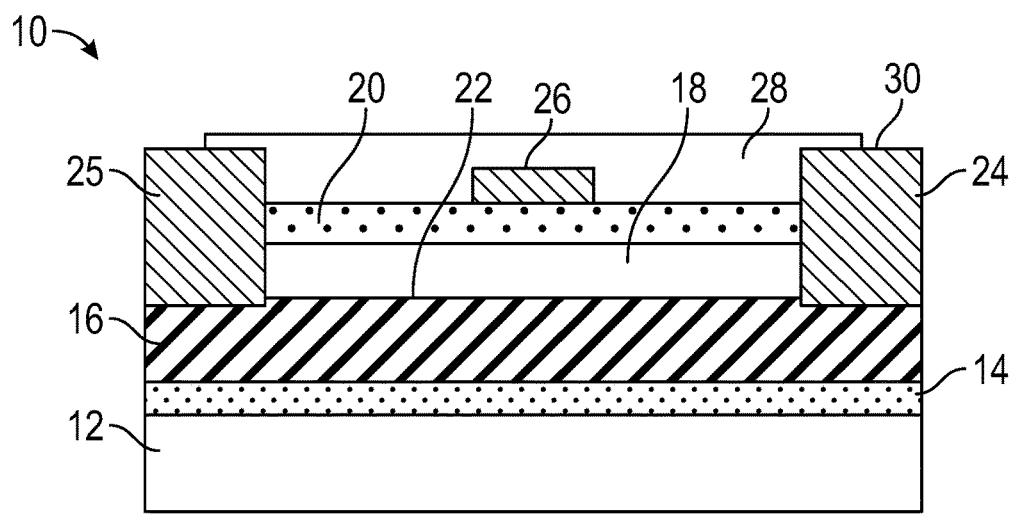
FIGS. 1-2 are cross-sectional views illustrating a process for forming a III-V device according to an exemplary embodiment.

The following detailed description is merely exemplary in nature and is not intended to limit the integrated circuits, wafer level integrated III-V device and CMOS driver device packages, and methods for fabricating products with integrated III-V devices and silicon-based driver devices. Furthermore, there is no intention to be bound by any expressed or implied theory presented in the preceding technical field, background or brief summary, or in the following detailed description.

For the sake of brevity, conventional techniques related to integrated circuit (IC) device fabrication, including CMOS device and group III-V device fabrication, may not be described in detail herein. Moreover, the various tasks and processes described herein may be incorporated into a more comprehensive procedure or process having additional functionality not described in detail herein. In particular, various processes in the fabrication of integrated circuits are well-known and so, in the interest of brevity, many conventional processes will only be mentioned briefly herein or will be omitted entirely without providing the well-known process details.

As used herein, it will be understood that when an element or layer is referred to as being "over" or "overlying" another element or layer, it may be directly on the other element or layer, or intervening elements or layers may be present. When an element or layer is referred to as being "on" another element or layer, it is directly on and in contact with the other element or layer. Further, spatially relative terms, such as "above", "lower", "upper", "top" and the like, may be used herein for ease of description to describe one feature's relationship to another feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or an orientation of below. The device may be otherwise oriented (rotated 90 degrees or at other orientations) and the spatially relative descriptors used herein may likewise be interpreted accordingly.

In accordance with the various embodiments herein, integrated circuits, wafer level integrated III-V device and CMOS driver device packages, and methods for fabricating products with integrated III-V devices and silicon-based driver devices are provided. The methods described herein provide for the formation and packaging of III-V devices and associated driver devices together. Heat removal from the III-V devices is facilitated with the inclusion of conductive vias in the CMOS driver device within the ILD layers thereof, the inclusion of conductive contacts in the CMOS driver device from the lower metal layer to the silicon substrate (or doped well in the substrate), as well as the use of back-side metallization on the CMOS silicon substrate. The Figures illustrate exemplary embodiments for III-V devices, driver devices, and integrated packages including III-V device and driver devices, and for fabricating integrated III-V device and driver device packages.

Figure 2:
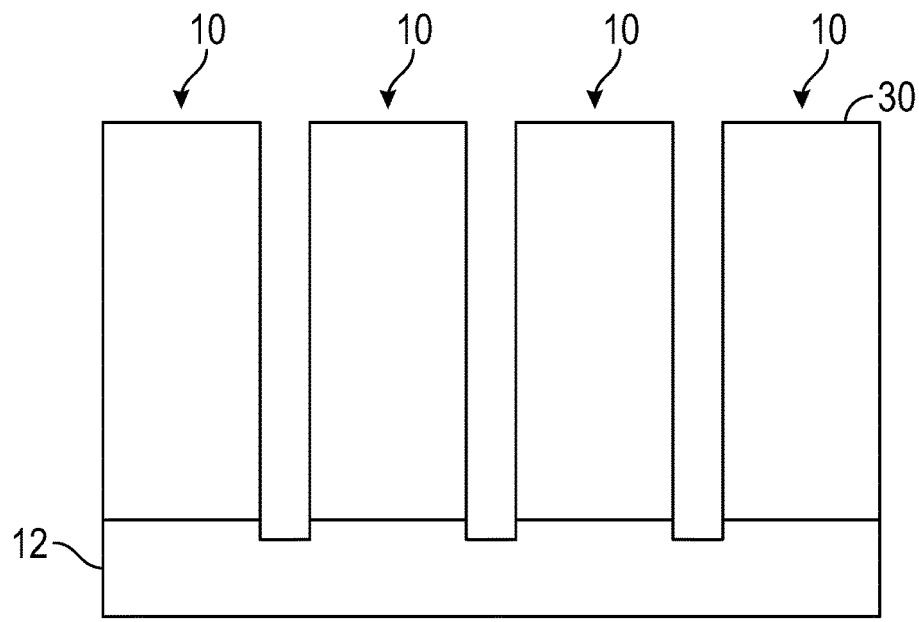

FIGS. 1-2 are cross-sectional views illustrating a process for forming a III-V device 10 according to an exemplary embodiment. In FIG. 1, a semiconductor substrate 12 is provided. The substrate 12 is the layer wherein semiconductor devices such as transistors, resistors, and the like are formed. An exemplary substrate 12 is a silicon, silicon carbide, or sapphire wafer. The substrate 12 may alternatively be a ZnO substrate, a nitride semiconductor substrate, or a substrate of another suitable material. In general, providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

As shown, a buffer layer 14 is formed over and on substrate 12. Buffer layer 14 may include a single layer or a stack of layers. In an exemplary embodiment, the buffer layer 14 is formed over the substrate 12 to gradually adjust the lattice constant from the lattice constant of the substrate 12 to a lattice constant more similar to layers formed overlying the buffer layer 14 (such as active GaN layers, as described below). When active GaN layers are formed on non-native substrates, i.e., non-GaN substrates, dislocations and other defects may be introduced into the active GaN layer due to the mismatch between the lattice constants, as well as the coefficients of thermal expansion (CTE), between the underlying substrate and the GaN layers. It is noted that a sapphire or silicon carbide substrate will have a lattice constant that is closer to the lattice constant of GaN as compared to a silicon substrate, and may provide for formation of higher-quality GaN layers or for use of fewer buffer layers. However, silicon substrates offer the advantage of being available in larger wafer sizes at much lower cost, and are compatible with a large installed base of silicon wafer processing equipment, resulting in lower manufacturing costs.

An exemplary buffer layer 14 is formed from layers of gallium nitride (GaN), aluminum gallium nitride (AlGaN), and aluminum nitride (AlN). The buffer layer 14 may have a total thickness of from about 0.5 to about 10 microns. For example, each layer of GaN, AlGaN, and or AlN may be formed with a thickness of from about 10 nm to about 1 micron.

In FIG. 1, a first active layer 16 is formed on and over the buffer layer 14. An exemplary first active layer 16 is formed of GaN, and may be referred to as i-GaN as opposed to a doped GaN material such as n-GaN or p-GaN. An exemplary first active layer 16 has a thickness of from about 0.5 to about 5 microns. Further, in the embodiment of FIG. 1, a second active layer 18 is formed on and over the first active layer 16. An exemplary second active layer 18 is formed of AlGaN. An exemplary second active layer 18 has a thickness of from about 0.5 to about 5 microns. Also, in the embodiment of FIG. 1, an optional cap layer 20 is formed on and over the second active layer 18. An exemplary cap layer 20 is formed of AlGaN. As used herein, a layer identified as a "formed of" a particular material or as being a "material" includes at least 50 wt. % of the recited material, such as at least 80 wt. %, or at least 95 wt. %. An exemplary cap layer 20 has a thickness of from about 0.1 to about 2 microns. In some embodiments, the second active layer 18 and cap layer 20 may include the same layer.

In an exemplary embodiment, the buffer layer 14, first active layer 16, second active layer 18, and cap layer 20 are laminated over the substrate 12 using a metal organic chemical vapor deposition (MOCVD) or a molecular beam epitaxy (MBE) process. A heterojunction 22, i.e., an interface between two layers of dissimilar crystalline semiconductors, exists between the first active layer 16 and the second active layer 18. As a result, a two-dimensional electron gas (2DEG) channel naturally exists at the heterojunction 22. The 2DEG channel may serve as a conduction channel for the III-V device 10.

After forming the active layers 16, 18 and cap layer 20, the process may continue with the formation of source/drain electrodes 24 and 25. The source/drain electrodes 24 and 25 may be formed as a metallization layer in the illustrated arrangement with regard to the cap layer 20. For example, a suitable contact metal or stack of contact metals may be deposited over the cap layer 20 and patterned. For example, to provide good electrical contact, the contact metal may be palladium, platinum, nickel, titanium, aluminum, and the like. Additional metal layers may be laminated on top of the contact metal layers to provide a metal surface that is suitable for integration as discussed below. For example, a solderable metal stack such as titanium, nickel, and gold or silver may be laminated on top of the contact metal layers to provide a solderable metal surface. A heat treatment may be carried out to form a good ohmic connection between each source/drain electrode 24 and 25 and the underlying 2DEG channel at the heterojunction 22. As a result, the III-V device 10 is provided with a current path from source/drain electrode 24, through the 2DEG channel along heterojunction 22, and through source/drain electrode 25.

As further shown in FIG. 1, a gate structure 26 including a gate electrode may be formed over the cap layer 20 in accordance with conventional processing. For example, a metal or other conductive material stack may be deposited and patterned to form a Schottky contact with the first active layer 16. The gate structure 26 may modulate the conductivity of the channel at the heterojunction 22 via variation of an applied gate voltage. Alternatively, a dielectric layer may separate the gate electrode from the active GaN layers, forming a metal-oxide-semiconductor gate structure 26 that likewise serves to modulate the conductivity of the channel at heterojunction 22 via variation of the applied gate voltage. In exemplary embodiments, the conductivity channel is present when zero potential is applied to the electrode of the gate structure 26, which means that the III-V device 10, which is a transistor in the embodiment of FIG. 1, is normally "ON" and can be turned "OFF" by applying a negative voltage on the electrode of the gate structure 26. In other embodiments, the III-V device 10 may be normally "OFF" and require a positive voltage on the electrode of the gate structure 26 to be turned "ON" and fully connect the channel between drain and source electrodes 24 and 25. Further, it is noted that while the III-V device 10 is formed as a transistor in FIG. 1, the III-V device 10 may be a diode or other device formed from III-V materials.

In the embodiment of FIG. 1, a passivation layer 28 is formed over the gate structure 26 and cap layer 20. An exemplary passivation layer 28 is a dielectric material such as silicon nitride, silicon dioxide, polyimide, and the like. The passivation layer 28 is removed over the source/drain electrodes 24 and 25 to allow for electrical contact to an upper surface 30 of the source/drain electrodes 24 and 25. The passivation layer 28 may also be removed over the gate structure 26 to allow for direct electrical contact to the gate structure 26.

While FIG. 1 illustrates the formation of a single III-V device 10, the method may form a plurality of III-V devices 10 arranged side by side over the substrate 12. In FIG. 2, a plurality of III-V devices 10 has been formed over substrate 12 and a cutting process is performed to separate such III-V devices 10. While not shown, each III-V device 10 in FIG. 2 may include buffer layer 14, first active layer 16, second active layer 18, cap layer 20, source/drain electrodes 24 and 25, gate structure 26 and passivation layer 28 as described in relation to the process of FIG. 1.

In an exemplary embodiment, a dicing process (e.g. laser dicing, dicing with a diamond stylus, or dicing by sawing) is performed to separate individual III-V devices 10. As shown, an exemplary dicing process separates the individual III-V devices 10 while the substrate 12 remains at least partially uncut. Each individual III-V device 10 includes the upper surface 30.

FIGS. 1-2 illustrate a process for forming III-V devices 10 according to an exemplary embodiment. In FIGS. 3A-4A and 3B-4B, processes are illustrated for forming a driver device 60 and interconnection structures thereto according to alternative exemplary embodiments.

Figure 3A:
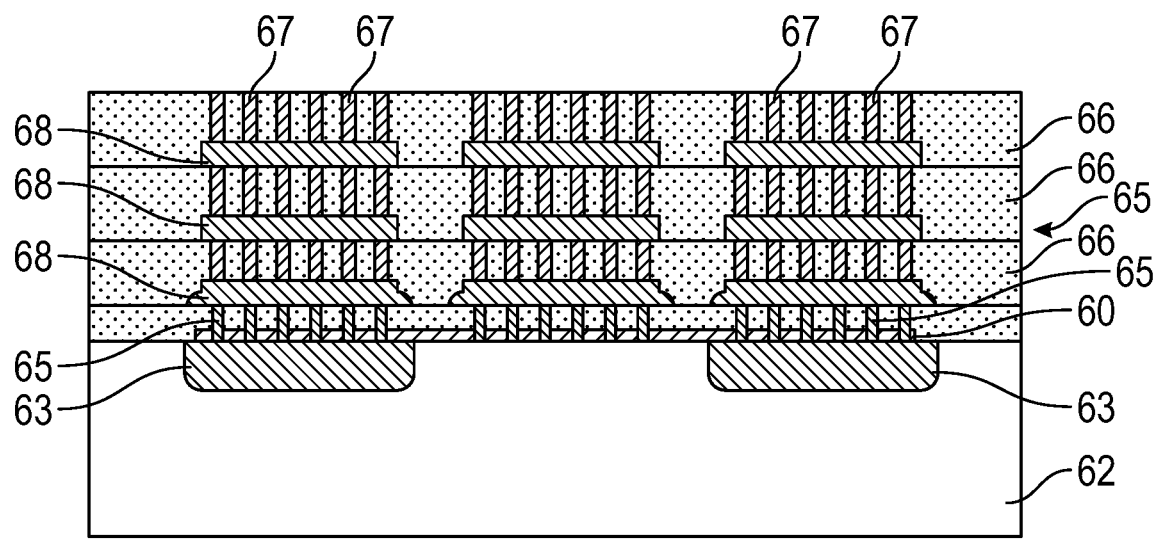
Figure 3B:
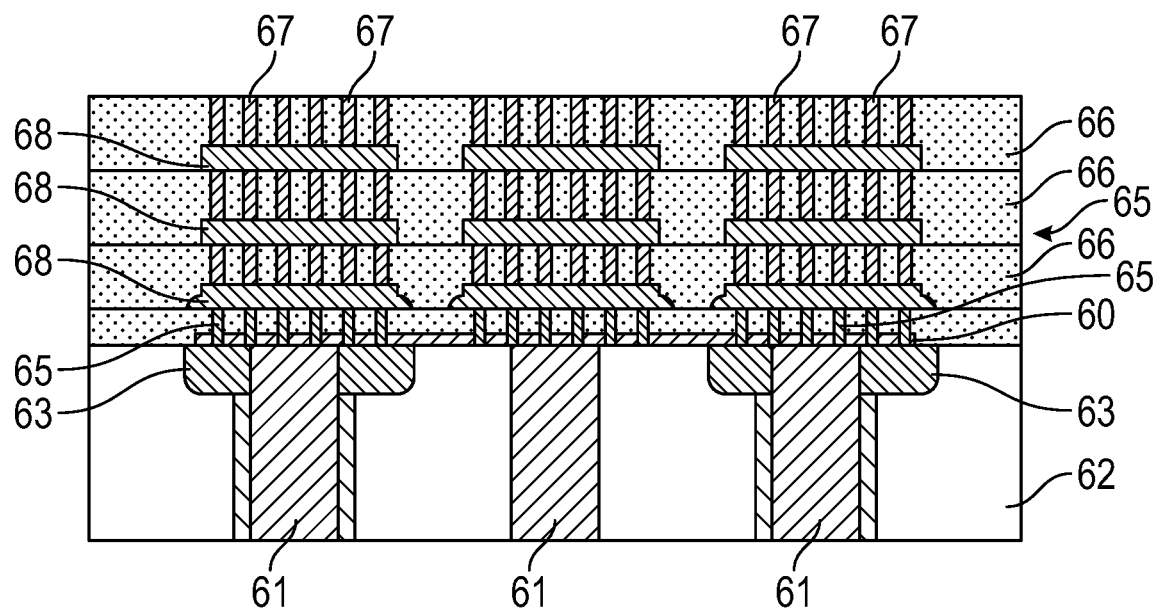

As shown in FIG. 3A, a semiconductor substrate 62 in and/or on which semiconductor devices are fabricated is provided. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 10 weight percent based on the total weight of the material unless otherwise indicated. The semiconductor substrate 62 may include one or more ion-doped wells 63, which may be doped with either N-type or P-type ions. The semiconductor substrate 62 may have undergone a thinning process to reduce its thickness (for example by chemical/mechanical planarization), which in turn improves heat transfer through the semiconductor substrate 62. In this regard, the thickness of semiconductor substrate may be from about 100 microns and about 1000 microns, such as from about 300 microns to about 600 microns.

A driver device 60, such as a metal oxide field effect transistor (MOSFET) or a plurality of transistors, is formed on the semiconductor substrate 62 according to conventional integrated circuit processing. An exemplary driver device 60 forms a gate driver circuit. A plurality of driver devices 60 may be located in a gate driver circuit region 65 of an integrated circuit. The semiconductor substrate 62 may include a plurality of gate driver circuit regions 65. In an exemplary embodiment, various metal and dielectric layer deposition and etching processes may be performed according to conventional integrated circuit processing to form a plurality dielectric layers 66 (1 through N), each with an embedded metallization structure 68, in selective contact with electrodes of the driver device 60. Vias 67 are provided through each of the plurality of dielectric layers 66, forming a continuous conductive path from the top of the top metal layer (MN) to the bottom metal layer (Mi). The vias 67 also allow heat to transfer more efficiently down through the dielectric layers 66. A plurality of contacts 65 electrically connect the bottom metal layer to the driver devices 60.

The driver device 60 is formed in FIG. 3A during a series of processes that form individual integrated circuit components, e.g., transistors, capacitors, resistors, etc., over substrate 62 that may be interconnected into a circuit by means of one or more metal interconnecting layers 68. A power integrated circuit is defined as an integrated circuit that controls high voltages, high currents, or both. For example, digital integrated circuits typically have operating voltages of 5V or lower, so any integrated circuit that controls voltages above 5V may be considered a power integrated circuit. Integrated circuits that control currents of more than 100 mA flowing through external loads may also be considered power integrated circuits. Some examples of power integrated circuits include DC/DC voltage conversion integrated circuits, e.g., buck converters, boost converters, drivers, motor drivers, etc. In an exemplary embodiment, the driver devices 60 are formed in a power integrated circuit.

Figure 4A:
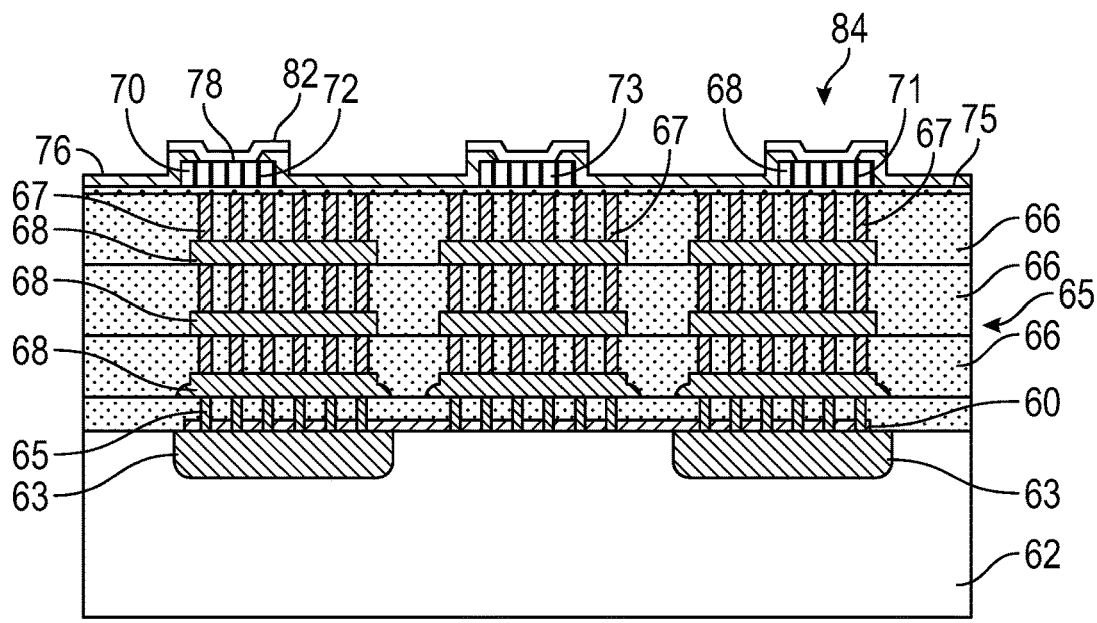

FIG. 4A provides a view of the upper portion of the structure of FIG. 3, wherein the metallization structure 68 now includes final metal pads or bond pads 70 as an uppermost metallization layer or electrode. For example electrodes 71, 72, and 73 may be formed over and interconnected to the gate driver circuit formed by driver device 60. Exemplary final metal pads 70 are copper, aluminum, or another suitable conductive material. The final metal pads 70 may extend above the upper surface 75 of the interlayer dielectric 66. The final metal pads 70 may be formed as an uppermost metallization layer over the interlayer dielectric 66.

In FIG. 4, a passivation layer 76 is deposited over the final metal pads 70 and the upper surface 75 of the interlayer dielectric 66. An exemplary passivation layer 76 is one or more dielectric materials such as silicon dioxide, silicon nitride, polyimide, or the like. In an exemplary embodiment, the passivation layer 76 is deposited by plasma enhanced chemical vapor deposition (PECVD) or similar suitable process. As shown, a portion of the passivation layer 76 is removed from the final metal pads 70 to provide exposed surfaces 78 of the final metal pads 70. For example, a conventional lithography process and reactive ion etching (ME) process may be performed to selectively remove the portions of the passivation layer 76 overlying the final metal pads 70.

The method may continue with forming an under-bump metallization (UBM) layer 82 over the final metal pads 70 and in contact with the exposed surfaces 78 of the final metal pads 70. An exemplary UBM layer 82 is formed of a laminated structure such as Ti/Pt/Au, Ti/Ni/Au, Ti/Ni/Ag, Ni/Au, Pt/Au or similar suitable metallization stacks. The UBM layer 82 may be formed by physical vapor deposition (PVD), evaporation, or other suitable processes. Attributes of the UBM layer for consideration include good mechanical adhesion to the final metal pads 70, a top surface that is compatible with the die attach process (discussed below), and good electrical contact between the die attach materials and the final metal pads 70.

As a result of the processing of FIGS. 3A-4A, an interconnection structure 84 is formed from the metal pads 70 and UBM layer 82 overlying the driver devices 60. The interconnection structure 84 is in selective electrical contact with driver devices 60.

FIGS. 3B-4B illustrate an alternative embodiment. The difference between FIGS. 3A-4A and FIGS. 3B-4B is that FIGS. 3B-4B illustrate the further inclusion of a conductive through-silicon vias 61, which may be surrounded by dopant, extending from the driver devices all the way through the silicon substrate 62. The inclusion of the through silicon vias 61 further promotes the transfer of heat through the CMOS device, as the conductive through-silicon vias 61 transfer heat more efficiently than silicon or doped silicon.

Figure 4B:
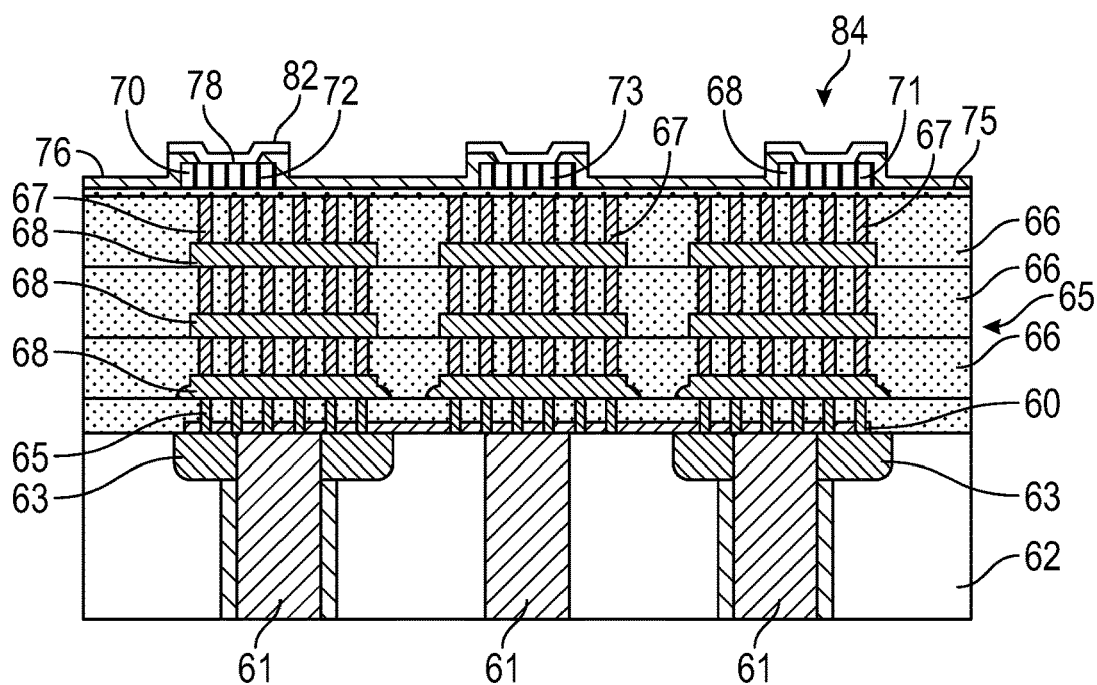
Figure 5:
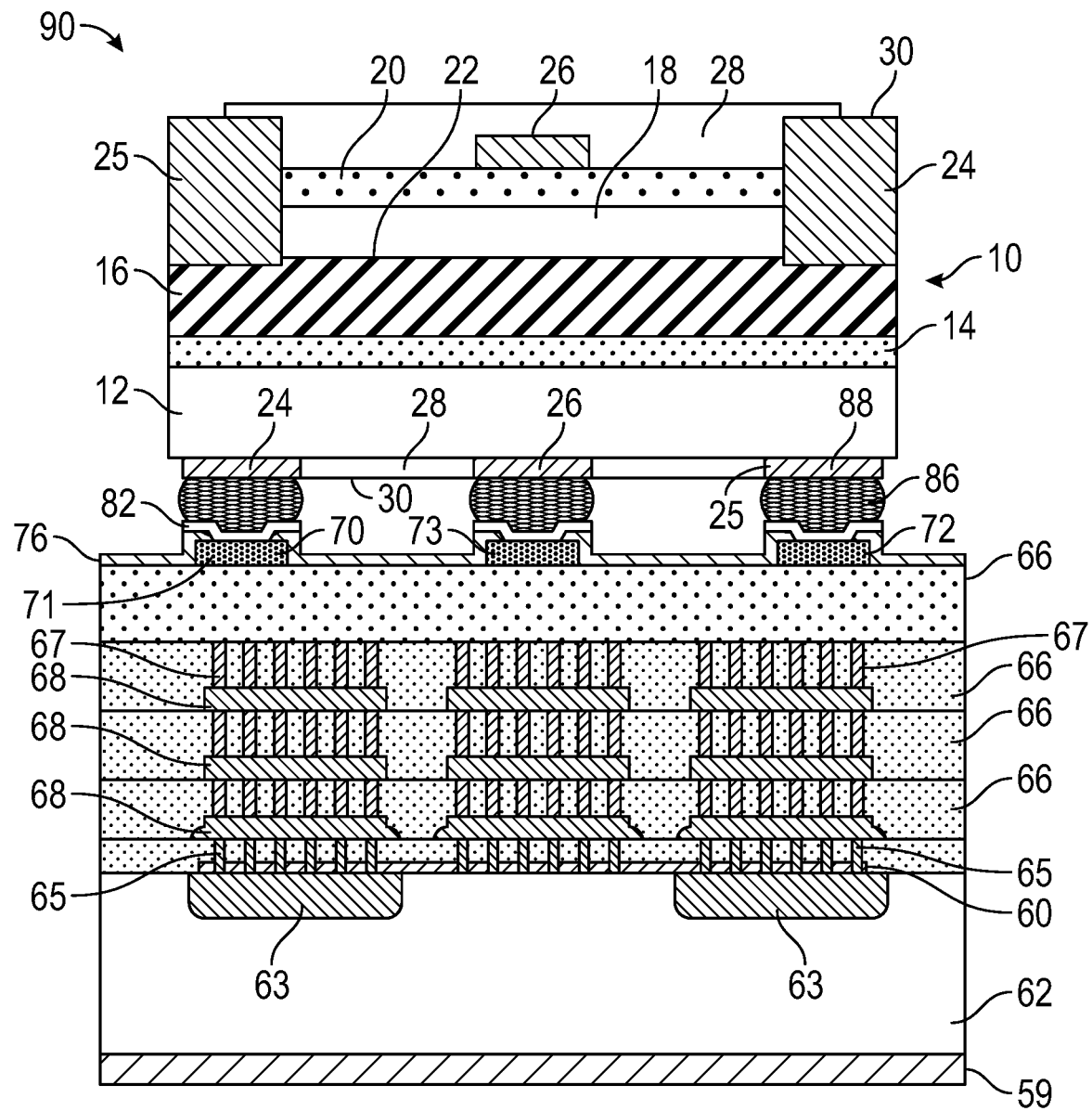
FIG. 5 is a cross-sectional view illustrating a process for connecting a III-V device to a driver device to form an integrated III-V device and driver device according to an exemplary embodiment.

The method continues in FIG. 5 (which should be understood as representative of either the embodiment of FIG. 3A-4A or 3B-4B) with the connection of a selected III-V device 10 from FIG. 2 to the driver device 60 through the interconnection structure 84 of FIG. 4A or 4B. Specifically, a die attach region 86 is positioned on each UBM layer 82, and the surface 30 of the III-V device 10 is contacted to each die attach region 86. An exemplary die attach region 86 may include a solder bump or solder layer, conductive epoxy or another suitable conductive and malleable material that may harden and adhere to provide a mechanical and electrical connection between III-V device 10 and the gate driver circuit region 65 of the integrated circuit. The die attach region 86 is deformable and forms a substantially planar upper surface 88 in contact with the source/drain electrodes 24 and 25 of III-V device 10. Further, the die attach region 86 adheres to the UBM layer 82 and to the III-V device 10 to bond the III-V device 10 and the driver device 60 together to form an integrated III-V device and driver device unit 90. The semiconductor substrate 62 may have provided on its underside a solderable backside metallization layer 59. The solderable backside metallization layer 59 includes a solderable metal such as tungsten. The solderable metallization layer 59 may be used to solder the substrate 62 to a package having conductive traces or to a PCB. The solderable metallization layer may further contribute to the heat transfer away from the group III-V device 10.

In an exemplary embodiment, the method includes forming a solder bump 86 in electrical connection with the selected III-V device 10, positioning the selected III-V device 10 over a selected driver device 60 such that the solder bump 86 is in contact with bond pad 70 and/or overlying UBM layer 82, and reflowing the solder bump 86 to provide electrical and mechanical coupling between the selected III-V device 10 and the selected driver device 60 of the integrated circuit. The solder bumps 86 may directly connect final metal pads of the integrated circuit 91 with electrodes (e.g. 24, 25, and/or 26) of the III-V device 10.

As fabricated in FIG. 5, the driver device 60 is configured to control a current flowing through the III-V device 10. In an exemplary embodiment, the III-V device 10 is a transistor including a drain electrode 24, a source electrode 25, and a gate electrode 26, while the driver device 60 includes a high voltage (HV) electrode 71, a low voltage (LV) electrode 72, and a gate-output electrode 73. As shown, the high voltage (HV) electrode 71 is coupled to the drain electrode 24 by a first solder bump 86, the low voltage (LV) electrode 72 is coupled to the source electrode 25 by a second solder bump 86, and the gate-output electrode 73 is coupled to the gate electrode 26 by a third solder bump 86.

Alternatively, electrodes 24, 25 and 26 and electrodes 71, 72, and 73 may be formed from a same, common material or metal and may be directly bonded. For example, Cu to Cu bonding or Al to Al bonding may be used.

Figure 6:
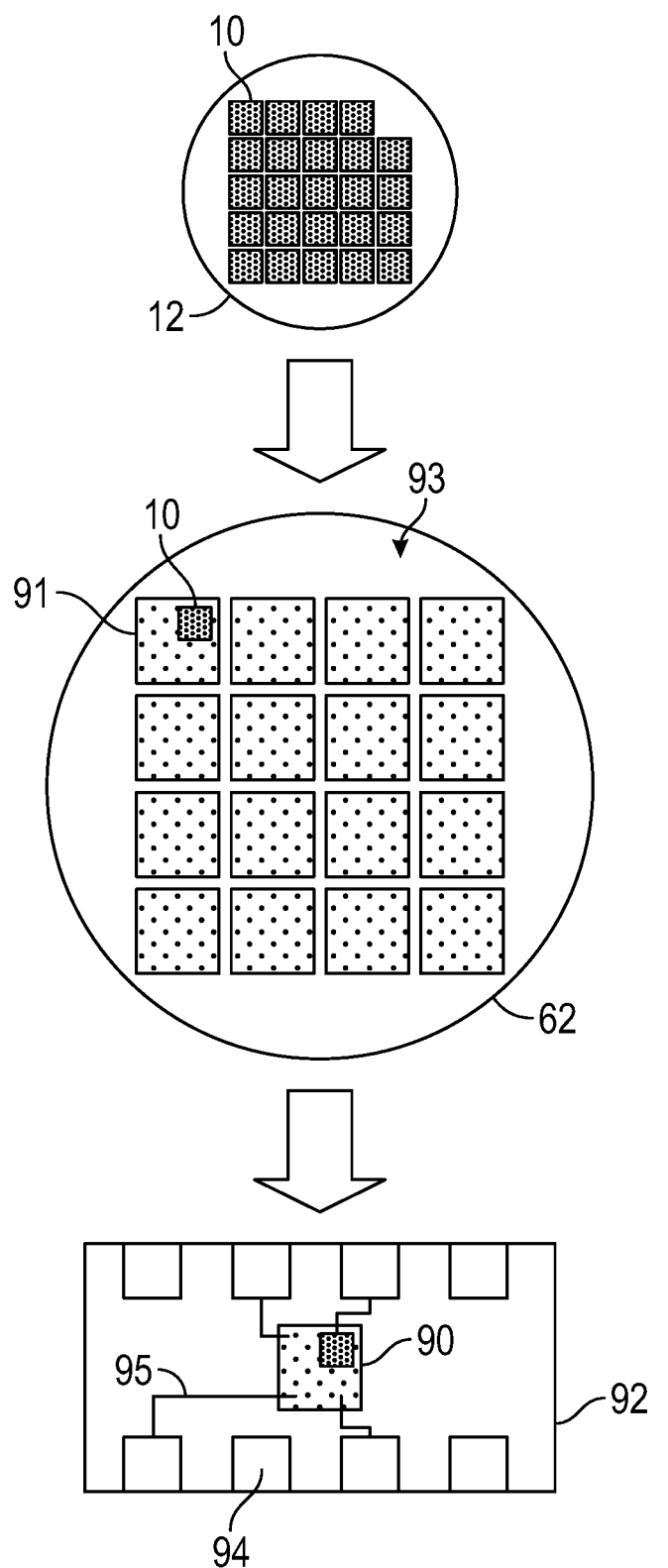
FIG. 6 is an overhead schematic view of the III-V device of FIG. 2 and the driver device of FIG. 4A or 4B during formation of an integrated III-V device and driver device according to FIG. 5.

FIG. 6 illustrates a method of forming a plurality of integrated III-V device and driver device units 90. As shown, substrate or wafer 12 includes a plurality of individual separated III-V devices 10. Further, another substrate or wafer 62 includes a plurality of integrated circuits 91. As shown, a selected III-V device 10 is separated from the other III-V devices 10 on substrate 12, such as by conventional die sawing, laser scribing, diamond scribing, or other suitable processes. The selected III-V device 10 is removed from substrate 12 and placed on top of a given integrated circuit 91 contained in substrate 62. By way of example, pick-and-place equipment may be used to place III-V device 10 on top of integrated circuit 91. This process may include a step in which III-V device 10 is flipped upside down, such that upper surface 30 of III-V device 10 is facing upper surface 75 of the ILD within integrated circuit 91. As noted above, die attach regions 86, such as solder bumps or epoxy bumps, may be formed on III-V device 10 prior to removing device 10 from substrate 12. Die attach regions 86 are positioned on the UBM layer 82 (not shown) of the selected integrated circuit 91 within substrate 62. Alternatively, the die attach regions 86 may be formed on the electrodes of integrated circuit 91, and the electrodes of the selected III-V device 10 may be positioned on die attach regions 86. In either case, the III-V device 10 is then aligned with and contacted to the interconnection structure (not shown) over the selected integrated circuit 91. As a result, an electrical and mechanical connection is formed between an integrated circuit 91 and a III-V device 10. In an exemplary embodiment, the above process is repeated with the removal of other III-V devices 10 from substrate 12 and placement of each III-V device 10 onto an integrated circuit within substrate 62. Each connected pair of III-V device 10 and driver device 60 forms an integrated III-V device and driver device unit 90. An integrated unit 91 may include one or more units 90, i.e. one or more III-V devices 10 in connection with one or more driver devices 60. The combination of an integrated circuit 91 with one or more III-V devices 10 produces a heterogeneous integrated circuit 93.

Each of the plurality of III-V devices 10 may be contacted to a respective gate driver circuit region 65 within the plurality of integrated circuits 91 on wafer 62 to form a plurality of heterogeneous integrated circuits 93 in wafer 62. The methods described herein provide for the integration of multiple III-V devices 10 with a single integrated circuit 91, and that integrated circuit 91 may contain a plurality of driver devices 60. In an exemplary embodiment, a selected integrated circuit 91 includes at least one gate driver circuit formed by one or more driver devices 60 and two III-V devices 10 to form, for example, a high-side switch and a low-side switch as commonly used in many power conversion topologies (e.g. Buck converters, boost converters, half-bridges). In another embodiment, a selected integrated circuit 91 includes at least one gate driver circuit formed by one or more driver devices 60 and four III-V devices 10 to form, for example, a full bridge stage as commonly used in many power conversion applications.

An optional passivation layer may be formed over wafer 62, which includes III-V devices 10 and integrated circuits 91. The passivation layer may be a dielectric material that is substantially conformal with the underlying gate driver circuit region 65 and III-V devices 10 and may provide mechanical protection (e.g. scratch resistance) and protection against ingress of moisture and/or mobile ions. Contact windows may be formed in selected areas of the passivation layer to allow further packaging. As manufactured, wafer 62 may be provided as a wafer level integrated III-V device and CMOS driver device package.

Alternatively, further packaging may be performed. For example, after the process of contacting selected III-V devices 10 to selected integrated circuits 91 is completed, a dicing process may be performed on the wafer 62 including the plurality of heterogeneous integrated circuits 93 to singulate the heterogeneous integrated circuits 93 from one another. The heterogeneous integrated circuits 93 are freestanding units that can be further packaged or mounted directly onto a package. In FIG. 6, the individual heterogeneous integrated circuits 93 may then be mounted directly onto a package 92 using conventional packaging techniques. For example, a heterogeneous integrated circuit 93 may be selected and removed from wafer 62 for placement on package 92 using pick-and-place equipment. Heterogeneous integrated circuit 93 may be attached to the leadframe of package 92 using conventional methods such as epoxy die attach or solder die attach. Electrical connection from the pins 94 of package 92 to the circuits of heterogeneous integrated circuit 93 may be provided by, for example, conventional wire bonding techniques. In this example, bond wires 95 may be connected between pins 94 and interconnection structures 84 of integrated circuit 91. Some bond wires 95 may also provide connection from pins 94 and the top-facing side of III-V devices 10. In another embodiment, package 92 may be a printed circuit board. The transfer of the integrated unit or units 90 to a package 92 may be performed utilizing conventional semiconductor packages and assembly equipment and techniques.

Accordingly, the methods described herein provide for the formation and packaging of III-V devices and associated driver devices together. Heat removal from the III-V devices is facilitated with the inclusion of conductive vias in the CMOS driver device within the ILD layers thereof, the inclusion of conductive contacts in the CMOS driver device from the lower metal layer to the silicon substrate (or doped well in the substrate), as well as the use of back-side metallization on the CMOS silicon substrate. As such, provided herein are group III-V devices and CMOS compatible integration schemes that allow for increased operating speeds and temperatures. Further provided herein are group III-V devices and CMOS compatible integration schemes that increase the removal of heat from the group III-V devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit comprising:
   a semiconductor substrate;
   a plurality of transistors overlying the semiconductor substrate;
   an interlayer dielectric layer overlying the plurality of transistors with a metallization layer disposed within the interlayer dielectric layer, the plurality of transistors and the metallization layer forming a gate driver circuit;
   a plurality of vias disposed through the interlayer dielectric layer;
   a gate driver electrode coupled to the gate driver circuit;
   a III-V device electrode overlying and coupled to the gate driver electrode; and
   a III-V device overlying and coupled to the III-V device electrode,
   wherein at least one of the plurality of transistors overlies a doped well within the semiconductor substrate.

2. The integrated circuit of claim 1, further comprising a plurality of interlayer dielectric layers overlying the plurality of transistors, and wherein each interlayer dielectric layer of the plurality of interlayer dielectric layers comprises a plurality of vias disposed therethrough.

3. The integrated circuit of claim 1, wherein the semiconductor substrate comprises a through-silicon via disposed through the semiconductor substrate.

4. The integrated circuit of claim 1, wherein the semiconductor substrate comprises a solderable backside metallization layer disposed underlying the semiconductor substrate.

5. The integrated circuit of claim 1, wherein the semiconductor substrate has a thickness of from about 100 microns to about 1000 microns.

6. The integrated circuit of claim 1, wherein the III-V device electrode is mechanically and electrically coupled to the gate driver electrode.

7. The integrated circuit of claim 1, further comprising a solder layer directly contacting the gate driver electrode and the III-V device electrode.

8. The integrated circuit of claim 1, further comprising a solder layer directly contacting, mechanically coupling and electrically coupling the gate driver electrode and the III-V device electrode.

9. The integrated circuit of claim 1, wherein the gate driver electrode is a first metal, the III-V device electrode is the first metal, and the gate driver electrode is directly bonded to the III-V device electrode.

10. The integrated circuit of claim 1, wherein the III-V device is a gallium nitride (GaN) transistor.

11. The integrated circuit of claim 10, wherein the III-V device electrode comprises a drain electrode coupled to the GaN transistor, a source electrode coupled to the GaN transistor, and a gate electrode coupled to the GaN transistor.

12. A wafer level integrated III-V device and CMOS driver device package comprising:
   a package having conductive trace lines or a printed circuit board;
   a semiconductor substrate;
   a solderable backside metallization layer disposed between the semiconductor substrate and the package or printed circuit board;
   a plurality of transistors overlying the semiconductor substrate;
   an interlayer dielectric layer overlying the plurality of transistors with a metallization layer disposed within the interlayer dielectric layer, the plurality of transistors and the metallization layer forming a gate driver circuit;
   a plurality of vias disposed through the interlayer dielectric layer; a gate driver electrode coupled to the gate driver circuit;
   a III-V device electrode overlying and coupled to the gate driver electrode; and
   a III-V device overlying and coupled to the III-V device electrode,
   wherein at least one of the plurality of transistors overlies a doped well within the semiconductor substrate.

13. The package of claim 12, further comprising a plurality of interlayer dielectric layers overlying the plurality of transistors, and wherein each interlayer dielectric layer of the plurality of interlayer dielectric layers comprises a plurality of vias disposed therethrough.

14. The package of claim 12, wherein the semiconductor substrate comprises a through-silicon via disposed through the semiconductor substrate.

15. The package of claim 12, wherein the semiconductor substrate has been subjected to a thinning process such that the semiconductor substrate has a thickness of from about 100 microns to about 1000 microns.

16. A method for fabricating an integrated boost converter, the method comprising:
   providing a semiconductor substrate;
   forming a plurality of transistors overlying the semiconductor substrate;
   forming an interlayer dielectric layer overlying the plurality of transistors and forming a metallization layer within the interlayer dielectric layer, the plurality of transistors and the metallization layer forming a gate driver circuit;
   forming a plurality of vias through the interlayer dielectric layer;
   forming a gate driver electrode coupled to the gate driver circuit;
   forming a III-V device electrode overlying and coupled to the gate driver electrode; and
   forming a III-V device overlying and coupled to the III-V device electrode,
   wherein at least one of the plurality of transistors overlies a doped well within the semiconductor substrate.

17. The method of claim 16, further comprising forming a through-silicon via through the semiconductor substrate.

18. The method of claim 16, further comprising forming a solderable backside metallization layer underlying the semiconductor substrate and joining a package having conductive trace lines or a printed circuit board to the semiconductor substrate using the solderable backside metallization layer.

* * * * *